United States Patent
Xu et al.

(10) Patent No.: US 11,322,290 B2
(45) Date of Patent: May 3, 2022

(54) TECHNIQUES FOR AN INDUCTOR AT A FIRST LEVEL INTERFACE

(71) Applicant: Intel Corporation, Santa Clara, CA (US)

(72) Inventors: Cheng Xu, Chandler, AZ (US); Yikang Deng, Chandler, AZ (US); Kyu Oh Lee, Chandler, AZ (US); Ji Yong Park, Chandler, AZ (US); Srinivas Pietambaram, Gilbert, AZ (US); Ying Wang, Chandler, AZ (US); Chong Zhang, Chandler, AZ (US); Rui Zhang, Cupertino, CA (US); Junnan Zhao, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 428 days.

(21) Appl. No.: 16/012,259

(22) Filed: Jun. 19, 2018

(65) Prior Publication Data

US 2019/0385780 A1    Dec. 19, 2019

(51) Int. Cl.
*H01F 27/28*       (2006.01)
*H01F 27/24*       (2006.01)
(Continued)

(52) U.S. Cl.
CPC ......... *H01F 27/2804* (2013.01); *H01F 27/24* (2013.01); *H01F 41/041* (2013.01);
(Continued)

(58) Field of Classification Search
CPC .... H01F 27/2804; H01F 27/24; H01F 41/041;
H01F 2027/2814; H01F 2017/0066; H01F 17/0013; H04B 5/0075; H01L 23/5227; H01L 28/10; H01L 21/822; H01L 24/06; H01L 2224/06131; H01L 2224/06134; H01L 2224/0401; H01L 2224/13022; H01L 2224/16112; H01L 2224/05548; H01L 2224/02372; H01L 2224/02375; H01L 24/05; H01L 24/02; H01L 24/29; H01L 24/81; H01L 24/83; H01L 2224/92125; H01L 24/32; H01L 2224/81203; H01L 2224/83104; H01L 2224/2919; H01L 2224/73204; H01L 2224/32225;
(Continued)

(56) References Cited

U.S. PATENT DOCUMENTS 7,786,836 B2 *  8/2010  Gabara ............... H01F 17/0006
                                                336/200
9,006,862 B2 *  4/2015  Palumbo ............... H01L 23/645
                                                257/531

(Continued)

*Primary Examiner* — Tuyen T Nguyen
(74) *Attorney, Agent, or Firm* — Schwegman Lundberg & Woessner, P.A.

(57) ABSTRACT

Techniques are provided for an inductor at a first level interface between a first die and a second die. In an example, the inductor can include a winding and a core disposed inside the winding. The winding can include first conductive traces of a first die, second conductive traces of a second die, and a plurality of connectors configured to connect the first die with the second die. Each connector of the plurality of connecters can be located between a trace of the first conductive traces and a corresponding trace of the second conductive traces.

6 Claims, 6 Drawing Sheets

(51) Int. Cl.
  *H04B 5/00*    (2006.01)
  *H01F 41/04*   (2006.01)
  *H01L 23/522*  (2006.01)
  *H01L 49/02*   (2006.01)
  *H01L 21/822*  (2006.01)

(52) U.S. Cl.
  CPC ........ *H01L 21/822* (2013.01); *H01L 23/5227* (2013.01); *H01L 28/10* (2013.01); *H04B 5/0075* (2013.01)

(58) Field of Classification Search
  CPC ... H01L 2224/133; H01L 24/13; H01L 24/16; H01L 2224/16145; H01L 2224/81191; H01L 2224/13294; H01L 23/645; H01L 2225/06517; H01L 2225/06572; H01L 2225/06527; H01L 2225/06513; H01L 25/0657; H01L 2224/16227; H01L 23/5385; H01L 23/5384
  See application file for complete search history.

(56) References Cited

U.S. PATENT DOCUMENTS

2005/0105225 A1*  5/2005  Ahn .................... H01F 17/0033
                                                       361/18
2014/0264734 A1*  9/2014  Luo .................... H01L 23/5384
                                                       257/531
2019/0164681 A1*  5/2019  Kidwell, Jr. ............ H01F 27/24

\* cited by examiner

TECHNIQUES FOR AN INDUCTOR AT A FIRST LEVEL INTERFACE

TECHNICAL FIELD

This document pertains generally, but not by way of limitation, to inductors, and more particularly, to an inductor formed at a first level interface of an integrated circuit.

BACKGROUND

Electronic circuit evolution continues to provide ever increasing functionality and speed from ever smaller systems. Such miniaturization pressures circuit designers to use less components, in smaller sizes, yet deliver the same or improved performance. Inductors have also been relegated to the same design constraints. However, in certain terms, better inductor characteristics typically require increase size in at least one dimension.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present inventors have recognized alternative techniques that can provide an inductor with increased z-axis form factor yet not increase the form factor of stacked integrated circuits connected at a first level interface. As used herein, a first level interface is an electrical and mechanical connection between a first semiconductor die and a second semiconductor chip, such as an interposer, a second die or a substrate of a package. It is anticipated that future integrated circuits may require significant power delivery improvements without increasing in size, especially in vertical height which may be referred to as a z-axis dimension or z-height. Magnetic inductor arrays can provide some improvement, but also require an external device that, in most cases, add to or will not satisfy future z-height requirements. Enabling magnetic materials on a coreless substrate may satisfy both future z-height requirements and performance, however, processes used to embed the magnetic components interact with wet chemistry processes such as, but not limited to, desmear, eless Cu, flash etch, soft etch, or surface finish. Magnetic materials can be exposed to the chemistry baths during processing and can result in premature corrosion, as well as, leaching of the magnetic materials into the baths. Such leaching can corrupt the bath resulting in shorter bath life and diminished chemistry performance, thus, adding additional costs to processing.

Figure 1A:
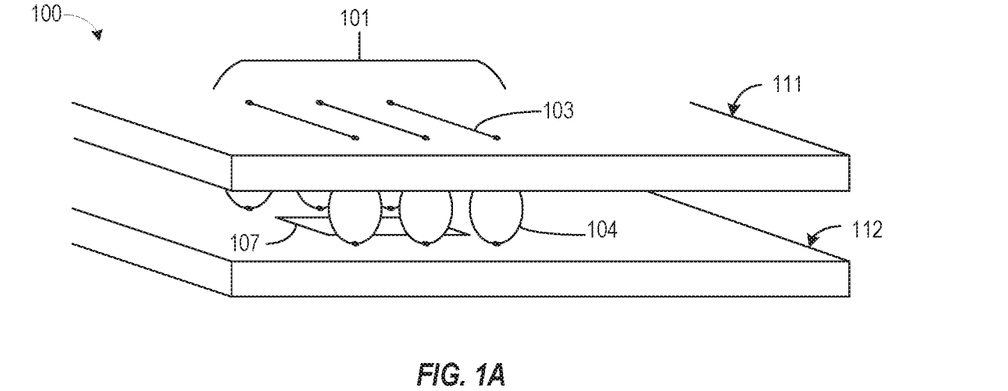
FIGS. 1A-1C illustrate generally a perspective view of die package including an inductor formed at a first level interface according to various examples of the present subject matter.
Figure 1B:
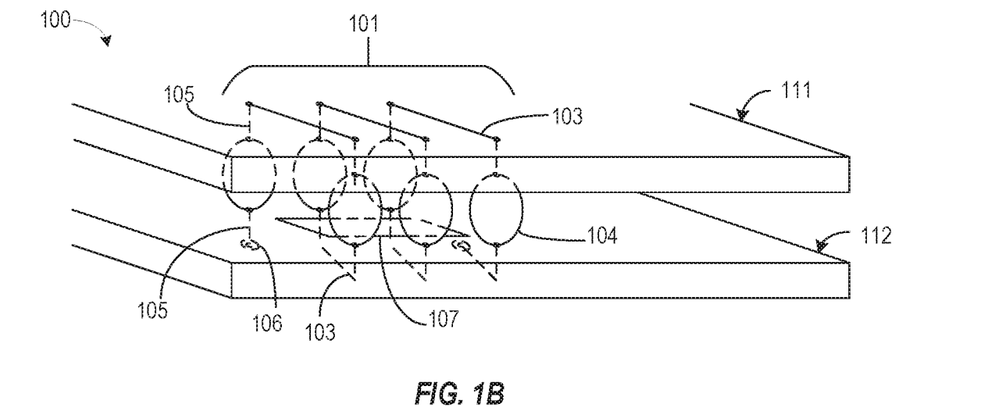
Figure 1C:
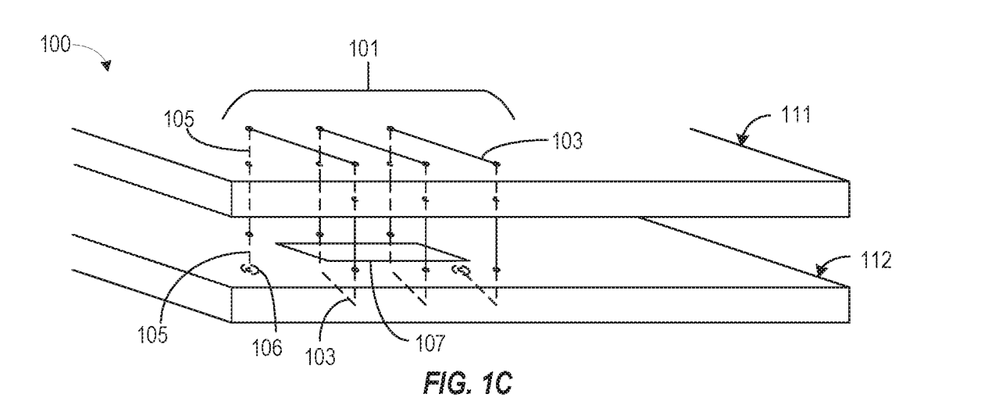

FIGS. 1A-1C illustrate generally a perspective view of die package 100 including an inductor 101 formed at a first level interface according to various examples of the present subject matter. The die package 100 can include a first die 111, a second die 112, and interconnects 102 of the first level interface for electrically and mechanically connecting the first die 111 with the second die 112. Each of the first die 111 and the second die 112 can include traces 103 embedded within, or located on a surface, of a semiconductor substrate of the respective die 111, 112. Each trace 103 can form a portion of an inductor coil. Upon connection of the first die 111 with the second die 112, the respective traces 103 can from one or more coil loops of the inductor 101. In certain examples, the inductor 101 does not include a magnetic core. In other examples, a magnetic material 107 can be applied to an external side of the substrate of either the first die 111, the second die 112, or a combination of the first die 111 and the second die 112 to provide a magnetic core inductor. FIG. 1A illustrates general a perspective view of an example inductor 101 formed at a first level interface. FIG. 1B illustrate generally the example of FIG. 1A with dashed lines to show hidden features of the assembled first and second die 111, 112. FIG. 1C illustrates generally the examples of FIGS. 1A and 1B with the solder balls interconnects 104 drawn as lines. FIG. 1C more clearly illustrates the multiple coils formed when the first die 111 and the second die 112 are electrically connected.

Each of the first die 111 and the second die 112 include traces 103 that form the inductor 101 when the dies 111, 112 are electrically connected together. The example of FIGS. 1A-1C show the traces 103 on or at a surface of each respective die 111, 112 that faces away from the center of the inductor 103. Conductive through-silicon-vias (TSVs), or conductive vias 105 extending through the particular substrate material of each die 111, 112, can couple a trace 103 to a respective interconnect 104 or to an interconnect pad 106 used to electrically couple the first and second dies 111, 112 together. In other examples, the traces 103 of each die can optionally be at or near the opposite surface of the respective die 111, 112, for example, the surface of the die facing the center of the inductor 101 and including the termination for the corresponding interconnect 104. In certain examples, such as that shown in FIGS. 1A and 1B, the interconnects 104 between the first die 111 and the second die 112 can include solder balls. It is understood that other interconnects besides solder balls or bumps can be used without departing from the present subject matter, including, but not limited to, connection pins, microballs (µballs), alloy paste, Cn/Sn bumps, or other suitable interconnect structure for a first level interface.

Figure 2A:
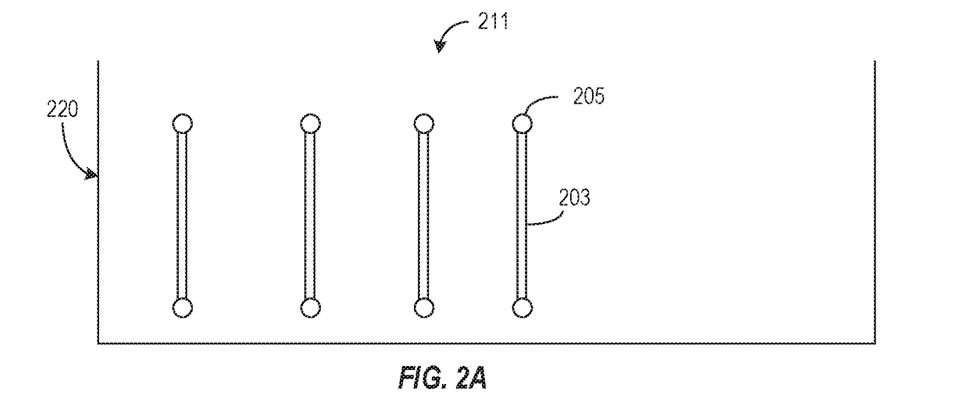
FIG. 2A illustrates generally top or bottom view of a first die configured to form an inductor at a first level interface.

FIG. 2A illustrates generally top or bottom view of a first die 211 configured to form an inductor at a first level interface. The first die 211 can include a substrate 220, and one or more traces 203 configured to form a portion of each coil of the inductor. In some examples, the traces 203 can be form on a surface of the first die 211. In some examples, the traces 203 can be integrated with the semiconductor substrate 220 of the first die 211. In certain examples, the first die 211 can optionally include vias 205, extending through the substrate 220, to connect a trace embedded within the substrate 220, or on a first surface of the substrate 220, with a termination on a second surface of the substrate 220. In certain examples, two or more external terminations of the first die 211 can connect with external terminations of a second die 212. In certain examples, the first die 211 can optionally include one or more terminations or one or more traces that couple the inductor to circuitry of the first die 211.

Figure 2B:
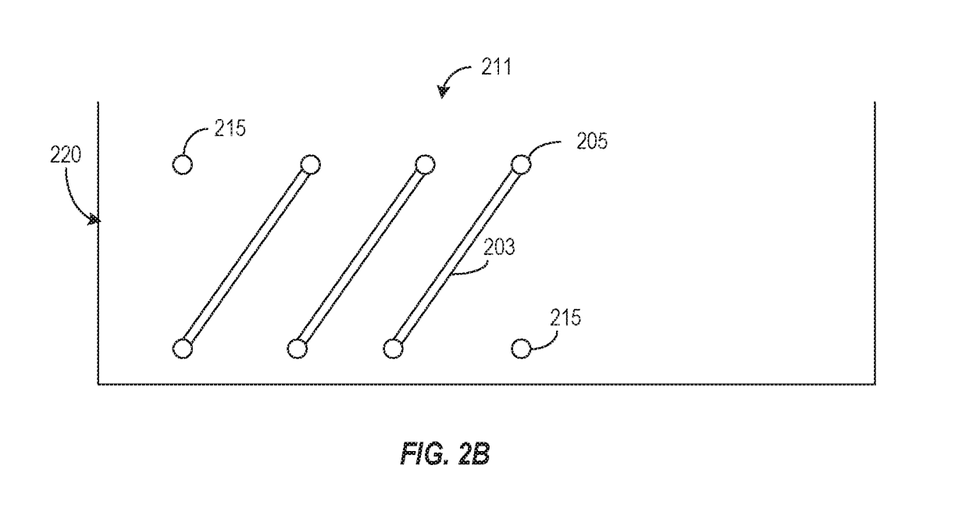
FIG. 2B illustrates generally top or bottom view of a second die configured to form an inductor at a first level interface when electrically and mechanically coupled with the first die of FIG. 2A.

FIG. 2B illustrates generally top or bottom view of a second die 212 configured to form an inductor at a first level interface when electrically and mechanically coupled with the first die 211 of FIG. 2A. The second die 212 can include a substrate 221, and one or more traces 203 configured to form a portion of each coil of the inductor. In some examples, the traces 203 can be located on a surface of the second die 212. In some examples, the traces 203 can be integrated with the semiconductor substrate 221 of the second die 212. In certain examples, the second die 212 can include vias 205 to connect a trace embedded within the substrate 221, or on a first surface of the substrate 221, with a termination on a second surface of the substrate 221. In certain examples, two or more external terminations of the second die 212 can connect with external terminations of the first die 211 to form one or more coils of the inductor. In certain examples, the second die 212 can optionally include one or more terminations 215 or one or more traces that couple the inductor to circuitry of the second die.

In certain examples, the surface of one of the dies that faces the inside of the inductor coils can include a magnetic material such that the inductor includes a magnetic core. The magnetic material can be assembled to the surface the die after most, if not all, of the chemical processing of the die has been completed. As such, the magnetic material is not exposed to processing materials that can accelerate corrosion, and chemical baths used to process the die are not exposed to contamination from the magnetic material.

Figure 3:
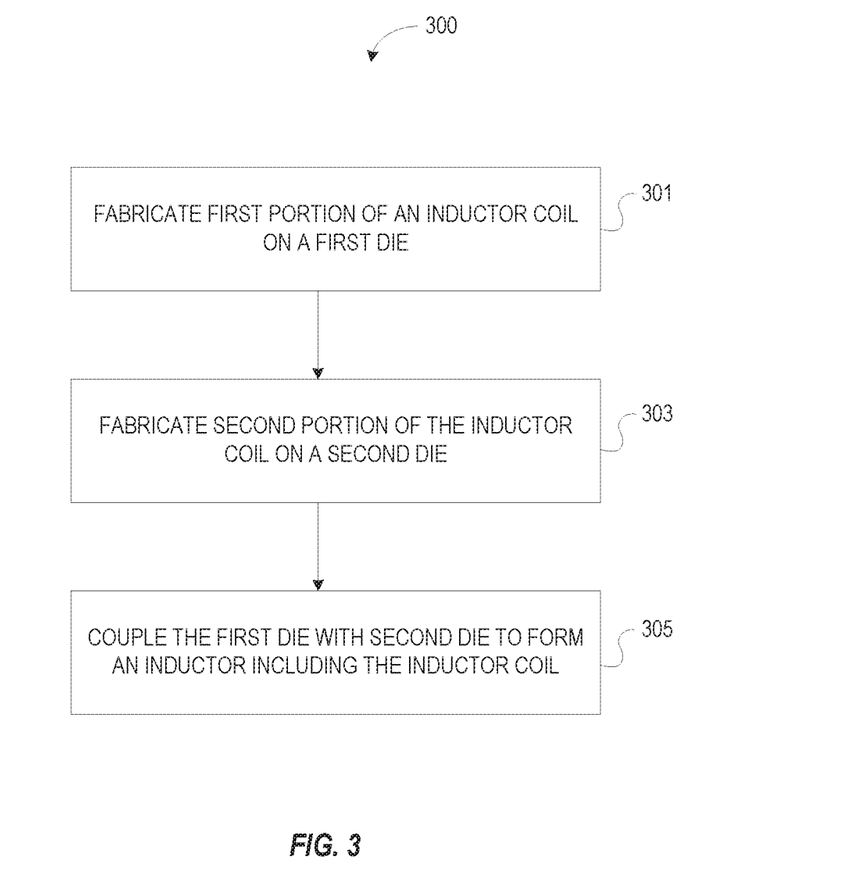
FIG. 3 illustrates generally a flowchart of an example method 300 for manufacturing an inductor at a first level interface that does not increase the z-height of the stacked integrated circuit dies.

FIG. 3 illustrates generally a flowchart of an example method 300 for manufacturing an inductor at a first level interface that does not increase the z-height of the stacked integrated circuit dies. At 301, a first portion of an inductor coil can be fabricated at or on a first die. In certain examples, the first portion can include a conductive trace deposited on, grown on, or embedded within the substrate of the first die. In some examples, the first portion can include conductive vias to extend the trace to an external or internal termination of the first die.

At 303, a second portion of the inductor coil can be fabricated at or on a second die. In certain examples, the second portion can include a conductive trace deposited on, grown on, or embedded within the substrate of the second die. In some examples, the second portion can include conductive vias to extend the trace to an external or internal termination of the second die.

At 305, the first die can be electrically and mechanically coupled with the second die and can include electrically and mechanically coupling the first portion of the inductor coil with the second portion of the inductor coil to provide an inductor having at least one conductive coil or turn. In certain examples, connecting the first portion of inductor coil can be electrically connected with the second portion of the inductor coil using die-to-die interconnects such as solder balls or pins. In such cases, the die-to-die interconnects can become part of the inductor and can form a portion of an inductor coil.

In some examples, a core material of the inductor can be fabricated on at least one of the first die or the second die such that the core material traverses through a coil of the inductor formed by the first portion, the second portion and the die-to-die interconnects. In some examples, the core material can include a magnetic material, such as, but not limited to, a ferrous material, organic magnetic materials, inorganic magnetic materials, composite magnetic materials, or combination thereof. In certain examples, the core material can be applied using sputtering, spin coating, lamination, paste printing, or combinations thereof.

Figure 4A:
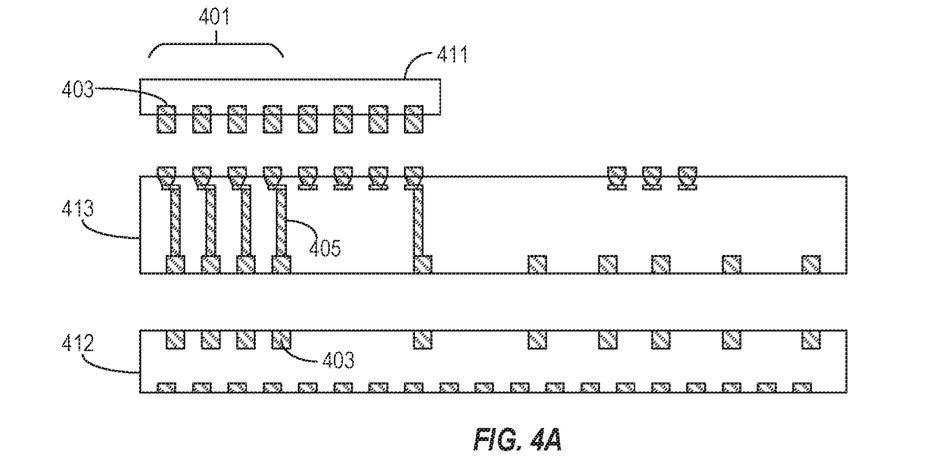
FIGS. 4A-4C illustrates generally an alternative configuration and method for an inductor 401 at a first level interface.
Figure 4B:
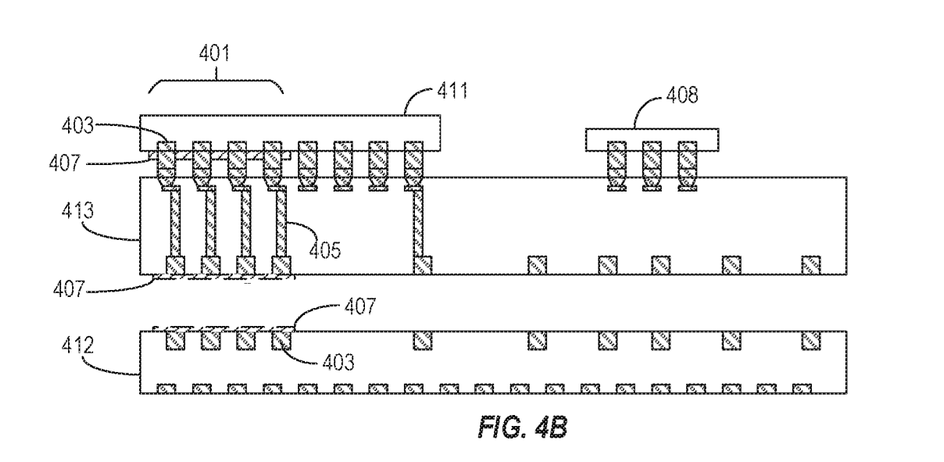

FIGS. 4A-4C illustrates generally an alternative configuration and method for an inductor 401 at a first level interface. FIG. 4A illustrates a first semiconductor die 411, a semiconductor interposer 413, and a semiconductor substrate or second semiconductor die 412. The first die 411 and the second die 412 can be fabricated to include traces 403 for the inductor 401 using conventional semiconductor fabrication techniques. Each individual trace 403 can form a portion of a coil of the inductor 401. FIG. 4B illustrates generally the assembled first die 411 and interposer 413. Prior to assembly, a magnetic material 407 can be applied to a surface of the first die 411, one or more surfaces of the interposer 413, or to a surface of the interposer 413 and a surface of the first die 411. The first die 411 and the interposer 413 can be assembled by, for example, thermal compression bonding (TCB), de-flux, and epoxy fill. Optionally, additional die 408 can be assembled to the interposer 413 on the same side as the first die 411. In some examples, the inductor 401 can be completed upon assembly of the first die 411 and the interposer 413 when the interposer 413 includes trace routings to complete the coils of the inductor 401.

Figure 4C:
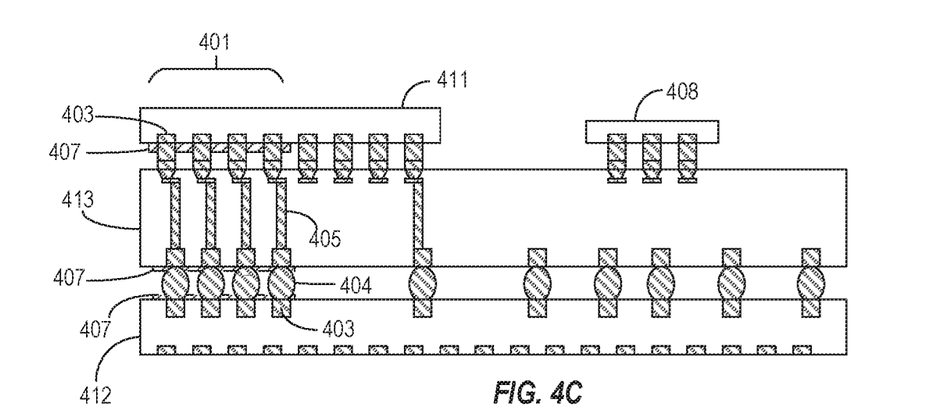

FIG. 4C illustrates generally a package assembly 400 including the assembled first die 411 and interposer 413, and the second die 412. In certain examples, traces or conductive vias 405 at the back side of the interposer can be connected to the second die 412 using interconnects 404 such as solder balls to complete the inductor 401. In such an example, the interposer 413 includes traces and vias 405 to form vertical portions of inductor coils, and the first and second dies 411, 412 include traces 403 to form horizon portions of the inductor coils. In some examples, magnetic material 407 can be applied to a surface of the second die 412. In general, the magnetic material 407 can be applied to any or all of the first die 411, second die 412 or interposer 413 such that upon assembly, the magnetic material 407 is enveloped within the coils of the inductor 401 as in the examples of FIGS. 1A-1C and 2A-2B. In certain examples, the magnetic material 407 can be applied by, but not limited to, chemical vapor deposition or sputtering. Such processes can allow use of insulating magnetic materials with higher permeability (1400-2400) including, but not limited to, FeXN, where Fe is iron, N is nitrogen and X can be Titanium (Ti), Aluminum (Al), Hafnium (Hf), Cobalt-Halfnium (CoHf), Chromium-Halfnium (CrHf).

Figure 5:
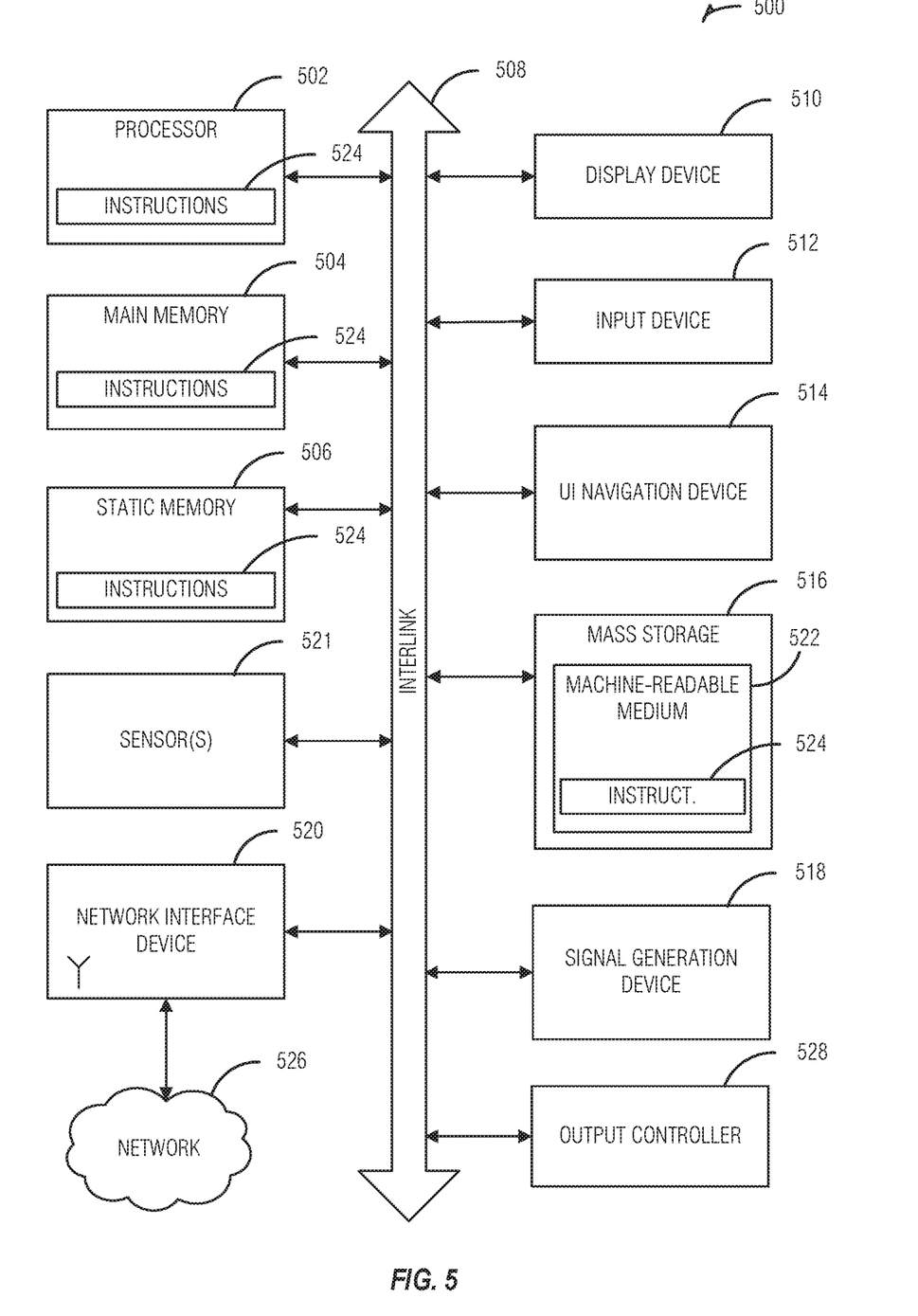
FIG. 5 illustrates a block diagram of an example machine upon which any one or more of the techniques (e.g., methodologies) discussed herein may perform. In alternative embodiments, the machine may operate as a standalone device or may be connected (e.g., networked) to other machines.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (or other distributed) network environment. As used herein, peer-to-peer refers to a data link directly between two devices (e.g., it is not a hub- and spoke topology). Accordingly, peer-to-peer networking is networking to a set of machines using peer-to-peer data links. The machine 500 may be a single-board computer, an integrated circuit package, a system-on-a-chip (SOC), a personal computer (PC), a tablet PC, a set-top box (STB), a personal digital assistant (PDA), a mobile telephone, a web appliance, a network router, or other machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 500 may include a hardware processor 502 (e.g., a central processing unit (CPU), a graphics processing unit (GPU), a hardware processor core, or any combination thereof), a main memory 504 and a static memory 506, some or all of which may communicate with each other via an interlink (e.g., bus) 508.

The machine 500 may further include a display unit 510, an alphanumeric input device 512 (e.g., a keyboard), and a user interface (UI) navigation device 514 (e.g., a mouse). In an example, the display unit 510, input device 512 and UI navigation device 514 may be a touch screen display. The machine 500 may additionally include a storage device (e.g., drive unit) 516, a signal generation device 518 (e.g., a speaker), a network interface device 520, and one or more sensors 521, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In certain examples, any one or more of the display unit 510, storage device 516, network interface device or combination thereof can include a multiple device PCIe card.

The storage device 516 may include a machine readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 516 may constitute machine readable media.

While the machine readable medium 522 is illustrated as a single medium, the term "machine readable medium" may include a single medium or multiple media (e.g., a centralized or distributed database, and/or associated caches and servers) configured to store the one or more instructions 524.

The term "machine readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 500, and includes digital or analog communications signals or other intangible medium to facilitate communication of such software.

Figure 6:
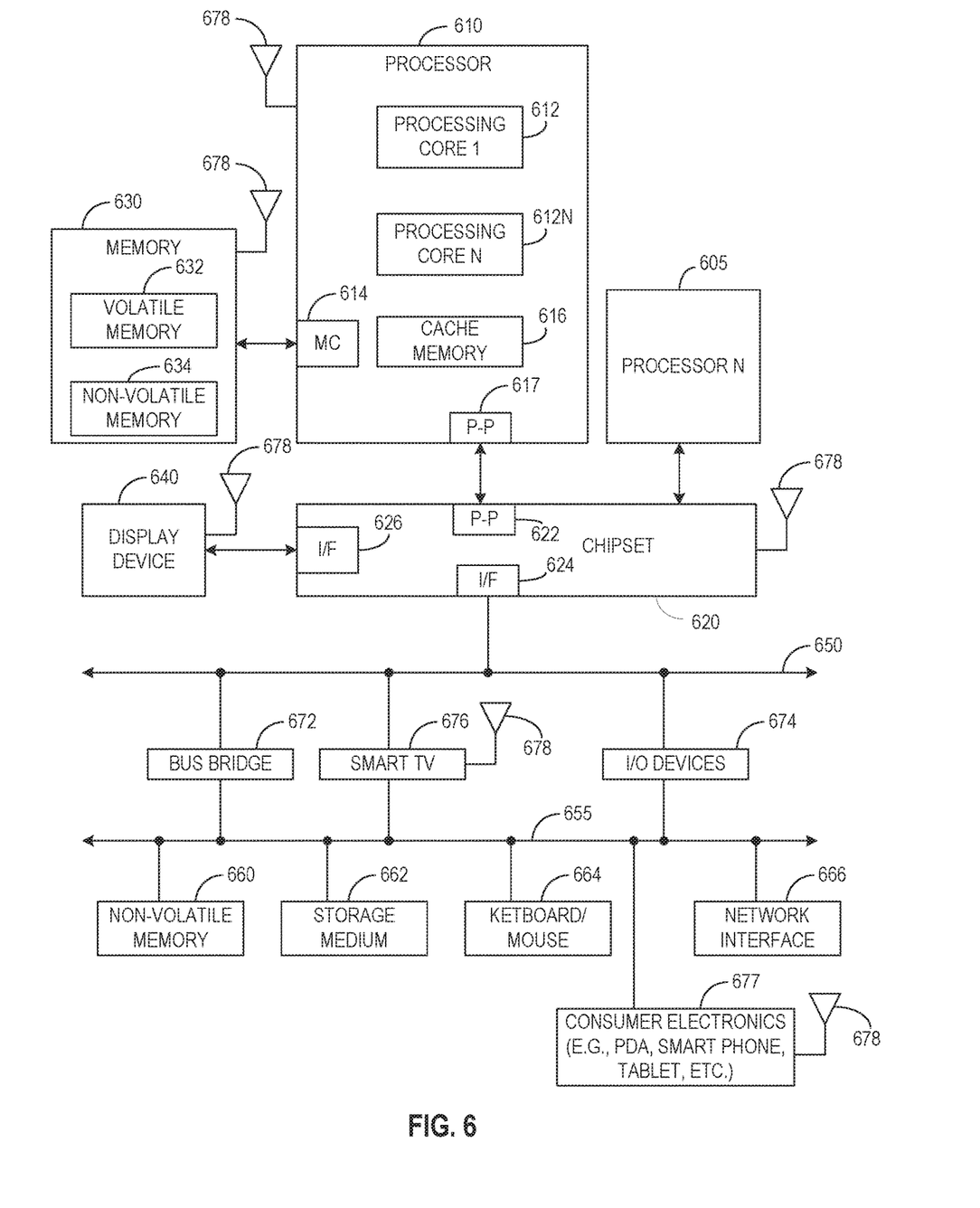
FIG. 6 illustrates a system level diagram, depicting an example of an electronic device (e.g., system) that can employ serial communication improvements as described in the present disclosure.

FIG. 6 illustrates a system level diagram, depicting an example of an electronic device (e.g., system) including a PCIe card as described in the present disclosure. FIG. 6 is included to show an example of a higher level device application that can use serial interfaces, such as those discussed above, exchange data between the illustrated components. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 602.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 602.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

ADDITIONAL NOTES

In a first example, Example 1, an apparatus can include a first die having first plurality of external terminations, a second die having a second plurality of external terminations, a plurality of connectors coupling the first plurality of external terminations to the second plurality of external terminations, and an inductor winding comprising the plurality of connectors.

In Example 2, an integrated circuit package optionally includes the second die of Example 1.

In Example 3, the plurality of connectors of any one or more of Examples 1-2 optionally includes solder balls.

In Example 4, the apparatus of any one or more of Examples 1-3 optionally includes a magnetic material disposed within the inductor winding and disposed between the first die and the second die.

In Example 5, the plurality of connectors of any one or more of Examples 1-4 optionally is arranged in two groups and the magnetic material is disposed between the two groups of connectors.

In Example 6, the magnetic material of any one or more of Examples 1-5 optionally is mechanically coupled to a surface of the first die, the surface directly adjacent the second die.

In Example 7, the magnetic material of any one or more of Examples 1-6 optionally is mechanically coupled to a surface of the second die, the surface directly adjacent the first die.

In Example 8, an inductor can include a winding, and a core disposed inside the winding. The winding can include first conductive traces of a first die, second conductive traces of a second die, a plurality of connectors configured to connect the first die with the second die, and each connector of the plurality of connecters can be located between a trace of the first conductive traces and a corresponding trace of the second conductive traces.

In Example 9, an integrated circuit package optionally includes the second die of any one or more of Examples 1-8 optionally.

In Example 10, the plurality of connectors of any one or more of Examples 1-9 optionally includes solder balls.

In Example 11, the core of any one or more of Examples 1-10 optionally includes a magnetic material within the winding and located between the first die and the second die.

In Example 12, the plurality of connectors of any one or more of Examples 1-11 optionally is arranged in two groups and the magnetic material is disposed between the two groups of connectors.

In Example 13, the magnetic material of any one or more of Examples 1-12 optionally is mechanically coupled to a surface of the first die, the surface directly adjacent the second die.

In Example 14, the magnetic material of any one or more of Examples 1-13 optionally is mechanically coupled to a surface of the second die, the surface directly adjacent the first die.

In Example 15, a method can include fabricating a first portion of an inductor coil at a substrate of a first die, fabrication a second portion of the inductor coil at a substrate of a second die, and electrically and mechanically coupling the first die and the first portion of the inductor coil with the second die and the second portion of the inductor coil.

In Example 16, the fabricating the first portion of the inductor coil of any one or more of Examples 1-15 optionally includes coupling a trace of the substrate forming a first portion of a first winding coil to first and second external terminations of the second die, the trace configured to form a first portion of a first complete winding of the inductor coil.

In Example 17, the method of any one or more of Examples 1-16 optionally includes depositing a magnetic material to the substrate of the first die between the first and second external terminations of the first die.

In Example 18, the fabricating the second portion of the inductor coil of any one or more of Examples 1-17 optionally includes coupling a trace of the second die to first and second external terminations of the second die.

In Example 19, the method of any one or more of Examples 1-18 optionally includes depositing a magnetic material to a surface of the second die between the first and second external terminations of the second die.

In Example 20, the electrically and mechanically coupling the first die and first portion of inductor coil with the second die and second portion of inductor coil of any one or more of Examples 1-19 optionally includes mechanically and electrically coupling a trace of the first portion of the inductor coil with a trace of the second portion of the inductor coil using a solder ball connector.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of"at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An apparatus comprising:
   a first die having first plurality of external terminations;
   a second die having a second plurality of external terminations;
   an interposer located between the first die and the second die, the interposer including a plurality of conductive vias;
   a plurality of connectors coupling the first plurality of external terminations to the second plurality of external terminations;
   an inductor winding comprising the plurality of connectors and the plurality of conductive vias; and
   a layer of magnetic material disposed in a space between the second die and the interposer, within a number of solder balls between the second die and the interposer.

2. The apparatus of claim 1, wherein an integrated circuit package includes the second die.

3. The apparatus of claim 1, wherein the plurality of connectors includes solder balls.

4. The apparatus of claim 1, wherein the plurality of connectors is arranged in two groups and the magnetic material is disposed between the two groups of connectors.

5. The apparatus of claim 1, wherein the magnetic material is mechanically coupled to a surface of the second die, the surface directly adjacent the interposer.

6. The apparatus of claim 1, wherein the magnetic material is mechanically coupled to a surface of the interposer, the surface directly adjacent the second die.

* * * * *